United States Patent [19]

Fanslow

[11] 4,051,435

[45] Sept. 27, 1977

[54] MICROWAVE FIELD DETECTOR

[75] Inventor: Glenn Ellsworth Fanslow, Ames, Iowa

[73] Assignee: Iowa State University Research Foundation, Inc., Ames, Iowa

[21] Appl. No.: 733,219

[22] Filed: Oct. 18, 1976

[51] Int. Cl.² ............... G01R 21/04; G01R 5/22; G02F 1/13

[52] U.S. Cl. ............... 324/95; 324/106; 325/363; 350/160 LC

[58] Field of Search ............... 324/95, 106, 72; 350/160 LC; 343/703; 325/67, 363

[56] References Cited

U.S. PATENT DOCUMENTS

| 2,449,072 | 9/1948 | Houghton | 324/95 |
| 3,693,084 | 9/1972 | Augustine | 324/106 |

*Primary Examiner*—Rudolph V. Rolinec
*Assistant Examiner*—Ernest F. Karlsen
*Attorney, Agent, or Firm*—Tilton, Fallon, Lungmus, Chestnut & Hill

[57] ABSTRACT

Liquid crystals having color play centered at different temperatures are arranged in a similar pattern on metal coated and non-metal coated disks which are used to monitor electromagnetic radiation. An embodiment which measures radiation in the range of 1 to 15 mW/cm² at 2.45 GHz is described. The monitor uses the temperature-dependent light scattering properties of liquid crystals as the measuring and indicating mechanism. While both disks will respond equally to changes in ambient temperature, the metal coated disk also responds to induced temperature changes caused by incident radiation. Thus the difference between the temperature indications of the two disks is a measure of the radiation present.

20 Claims, 4 Drawing Figures

A - LIQUID CRYSTALS
B - BLACK PAINT
C - MYLAR
D - METAL FILM

A - LIQUID CRYSTALS
B - BLACK PAINT
C - MYLAR
D - METAL FILM

MICROWAVE FIELD DETECTOR

BACKGROUND OF THE INVENTION

This invention relates to microwave field detectors.

The measurement of electromagnetic energy is required for determining leakage of electromagnetic energy, testing of equipment for meeting performance standards, surveying for hazardous fields and other applications such as would be required for experimental purposes. One of the most important needs is in the area of leakage monitoring for possibly hazardous fields in the vicinity of high power microwave sources such as microwave ovens and radar.

Present methods of monitoring make use of antenna-detector configurations and associated metering equipment. This method is often inaccurate because the probe can disturb the field and the need for metering increases the complexity and cost for this approach.

Another approach uses a spherical film bolometer to absorb the incident energy and change the pressure within the sphere. The change in pressure produces a movement of an indicating fluid in a capillary attached to the sphere. The movement is a measure of the field intensity. Some of the drawbacks to these methods are the cost of construction, the instrumentation required and difficulties with operation such as the sticking of the indicating fluid and disturbance of the field by the instrument.

The use of liquid crystals for heat imaging is known. These methods generally convert infrared or electrical energy into a heat pattern and thereafter apply the heat pattern to the liquid crystals to provide a color image corresponding to the heat pattern.

Liquid crystals have also been used for heat imaging of a microwave detector. For an example see the Augustine U.S. Pat. No. 3,693,084. A film of liquid crystals is in close proximity with a thin, continuous resistive layer. A microwave field incident on the composite structure generates alternating currents in the resistive layer which are in accord with the intensity of the microwave energy. The alternating electrical currents generate a heat pattern through dissipation in the resistive layer which corresponds to the intensity distribution of the incident microwave field. The heat pattern is imposed on the adjacent liquid crystals through thermal transfer. Since the liquid crystals assume particular colors in accordance with the temperature of the crystals, they will respond chromatically to incident microwave energy levels. Thus, a visible color pattern is produced representative of the pattern of intensity distribution of the microwave field. The resistive layer of the detector is constructed such that it has a resistivity of 377 ohms per square so that the impedance of the composite structure equals that of free space. Thus, microwave energy having a direction of propagation perpendicular to the resistive layer is theoretically absorbed therein. As a result of the absorption, the temperature of the detector is a direct quantitative measure of the power level of the incident microwave energy and may be determined by calibration of the detector. Calibration is accomplished by passing a direct current through the resistive layer. Microwave power and DC calibration current power of equal amounts provide the same film temperature. A reference detector may be used along with the main detector for mixed fields of infrared and microwave energy, arranged so that both absorb infrared energy while only the main detector also absorbs microwave energy. Calibration current through the reference detector to equalize the liquid crystal displays provides a measure of only the microwave energy.

SUMMARY OF THE INVENTION

An object of this invention is to provide a microwave field detector which is inexpensive, does not require instrumentation, can be made to have negligible effect on the field being measured, and is not susceptible to burnout.

According to the invention, a detector for determining the intensity of a microwave field makes use of a detection unit having several temperature sensitive areas with each area sensitive to a different small temperature range, and a layer of resistive material adjacent to the temperature sensitive areas. The resistive material is excited by an incident microwave field so that induced electrical currents produce heating corresponding to the intensity of the field, resulting in one of the temperature sensitive areas generating a visible signal to thereby show the temperature, which is a measure of the field intensity.

A further feature of the invention relates to a reference detector unit which has temperature sensitive areas corresponding to those of the main detector unit arranged in the same manner, so that each area of the reference detector corresponds with an area of the main detector having substantially the same temperature sensitivity; but with the reference detector unit omitting the layer of resistive material. Both the main and the reference detector units are then sensitive to ambient heating conditions and in the absence of a microwave field have similar displays. When placed in a microwave field, only the main detector has an additional response to the microwave field, so that the difference between the two detectors represents only the microwave field intensity.

In the disclosed embodiment of the invention the temperature sensitive areas are liquid crystals.

Another feature relates to placing the liquid crystals in concentric rings.

A measuring device may be provided in the form of a slider having an arrow placed over the reference device display area, and having a scale to read the field intensity over the display area of the main detector unit.

THE DRAWING

DETAILED DESCRIPTION

Figure 1:
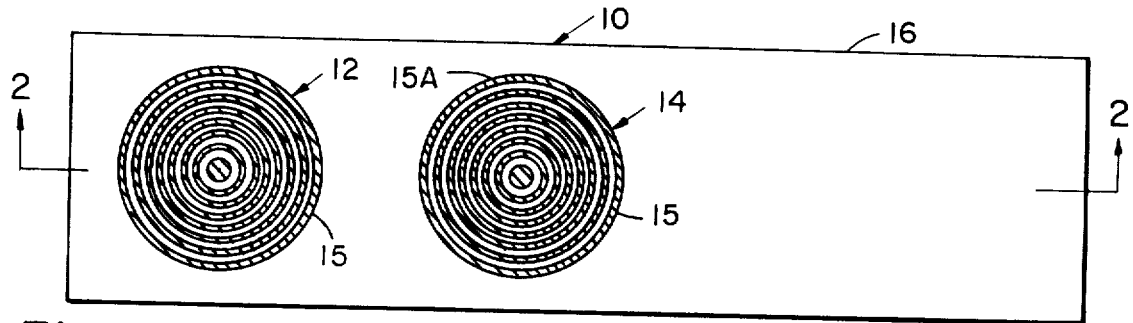
FIG. 1 is a top view of a radiation monitor.
Figure 2:
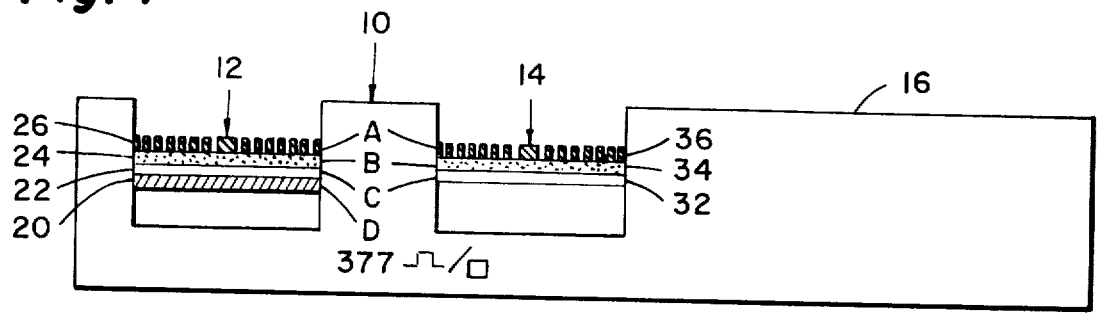
FIG. 2 is a sectional view along lines 2—2 of FIG. 1.

Referring now to FIGS. 1 and 2, there is shown a calorimetric radiation monitor that uses the temperature-dependent light scattering properties of liquid crystals as its measuring and indicating mechanism. FIG. 1 is a top view, and FIG. 2 is a sectional view along line 2—2 of FIG. 1. The monitor 10 utilizes two liquid crystal temperature-sensing disks having the same liquid crystal pattern, namely a main or radiation sensitive region or disk 12 and a reference region or disk 14. While both disks respond to ambient temperature changes due to changes in ambient conditions, the main disk 12 also responds to temperature changes due to the presence of incident microwave radiation, as will be described. Thus, the difference between the visual temperature indications of the two disks is a measure of the radiation present.

Liquid crystals have been used to map electromagnetic fields, to serve as temperature probes, and to meter microwave power density. The principle involved in each of these applications is the utilization of the temperature dependent property of cholesteric liquid crystals to selectively scatter ambient light. In general, the approach has been to coat a suitably prepared substrate with liquid crystals and subject it to the radiation of interest. The amount of radiation heating of the substrate is then shown as a color, because the liquid crystal coating displays color as a function of its temperature; color play is limited to a temperature range that is dependent upon the compounds, or mixtures of compounds, that are used. Using mixture data from J. L. Fergason, "Liquid Crystals in Nondestructive Testing", Appl. Opt., 7(9): 1729–37 (1968) and long-term stability information given by L. C. Scala and G. D. Dixon, "Long Term Stability of Cholesteric Liquid Crystal Systems" II, "Mol. Cryst. Liq. Cryst.", 10: 411–23 (1970), liquid crystal solutions were formed that would have color play centered at different temperatures. Approximate temperatures for color play ranged from 20° to 30° C.

Temperature sensing disks, 3 cm. in diameter, were formed from a metal film MYLAR, having a thickness of 0.002 inches and a resistance of 377 ohms/square. Disks of the same diameter, having a thickness of approximately 0.005 inch, were formed from plain Mylar sheeting. Thermal response characteristics for both types of disks were substantially the same. The disks were coated with a black paint to absorb all light not scattered by the liquid crystals, and the liquid crystals were then deposited in eight concentric rings (including a center dot), as illustrated in FIGS. 1 and 2. The space between the liquid crystal rings may be filled with a clear material, but this is not necessary. The temperature required for color play is highest in the outermost ring 15 and decreases monotonically with each ring toward the center of the disk. With the exception of the areas where the liquid crystals are producing a color play, the disks appear black.

The metal-coated temperature sensing main disk 12 and temperature sensing reference disk 14 are mounted in spaced relation in a styrofoam base 16. The main disk 12 comprises the metal film 20 on Mylar film 22, coated with black paint 24, and the liquid crystals 26 deposited in concentric rings. The reference disk 14 has Mylar film 32 with black paint 34 and liquid crystal rings 36 deposited in concentric relation. Corresponding rings of the two disks exhibit color play at the same temperature; and, as mentioned, the rings are arranged in predetermined order of color play.

The radiation to be measured comes from the back in FIG. 1, and from the bottom in FIG. 2. The styrofoam base provides shielding for infrared coming from the direction of the radiation source and the sides. In addition, the operation compensates for infrared radiation arriving from the viewing side (the top) because both of the sensors respond to infrared from that direction.

The function of the black surfaces 24, 34 is to absorb light not scattered by the liquid crystals. Other materials with are dielectric may be used, such as black Mylar film.

Figure 3A:
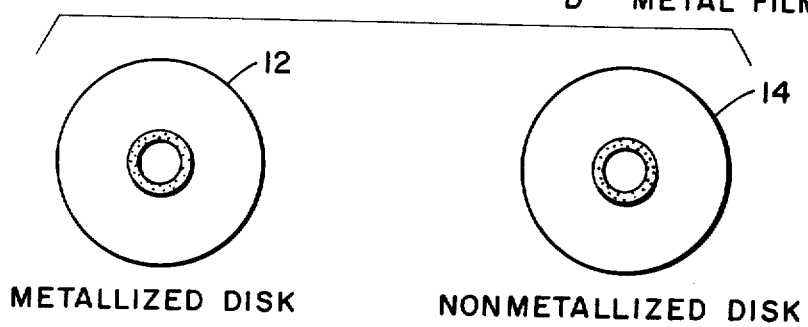
FIGS. 3A and 3B are diagrammatic views illustrating the use of the radiation monitor.
Figure 3B:
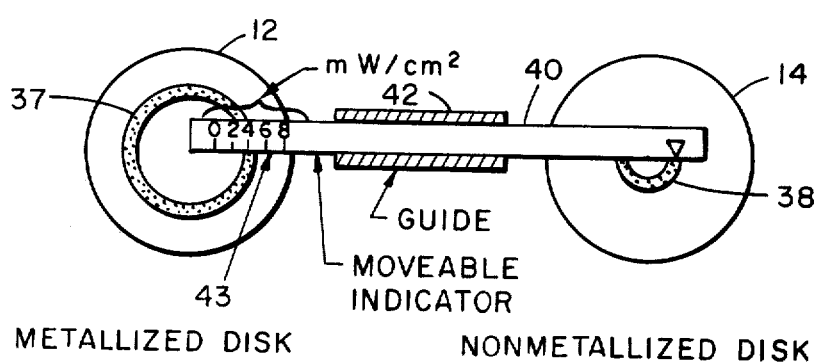

The principle of operation is illustrated in FIGS. 3A and 3B. In these figures only the rings having color play are visible. In FIG. 3A color play of the two disks is the same (rings of corresponding position in the pattern have the same color play) because there is no radiation present. In FIG. 3B a difference in the color play of the two disks (larger ring 37 has color play on main disk, whereas smaller ring 38 exhibits color play on the reference disk 14) is produced by the presence of radiation. Color play of the nonmetalized reference disk 14 shows that the ambient temperature has not changed from that which produced the display of FIG. 3A.

Direct reading of the radiation may be accomplished by positioning a movable indicator bar 40 over the disk, slidable in a guide 42. An arrow on the indicator bar 40 is positioned over the ring 38 having color play on the reference disk 14 and the radiation is read on the scale 43 of the indicator bar 40 above the ring 37 that exhibits color play on the metalized disk 12.

In an embodiment of the monitor having eight liquid crystal rings on the metalized disk, and eight corresponding rings on the reference disk, nominal values of the liquid crystal mix and approximate temperatures for color play are shown in Table I. The ring number is read from the outermost ring 15 to the center dot 15A.

Table I

| Ring No. | OCC/CN | Temperature ° F |
|---|---|---|
| 1 | 55/45 | 86° |
| 2 | 60/40 | 84° |
| 3 | 65/35 | 82° |
| 4 | 67.5/37.5 | 81° |
| 5 | 70/30 | 80° |
| 6 | 72.5/27.5 | 79° |
| 7 | 75/25 | 78° |
| 8 | 77.5/22.5 | 77° |

In the table, OCC is Cholesteryl Oleyl Carbonate, and CN is Cholesteryl Nonanoate. p- (p Ethoxyphenyl - azo) Hexanoate has been added as an ultraviolet absorber and silicone resin (G.E. SR 112) has been added to reduce deterioration of intensity of color play due to oxygen and atmospheric contaminants. The chemicals were from Eastman Kodak Co.; and the solvent was chloroform.

The detector was used to measure leakage radiation from a microwave oven that was operating at a nominal frequency of 2.45 GHz. Values of leakage radiation were first determined by measuring these with a NARDA Model 8100 radiation meter. For an indicated radiation level of 2 mw/cm$^2$ the ring in the seventh position of the reference disk had color play and the ring in the fifth position of the metallized disk had color play. For an indicated radiation level of 12 mw/cm$^2$ the ring in the seventh position on the reference disk had color play and the ring in the third position on the metallized disk had color play.

The disk diameter, 3 cm, is approximately a quarter wavelength at 2.45 GHz.

The purpose of the reference disk is to compensate the display for changes that would occur due to shifts in ambient temperature and any incident infrared radiation. This latter type of disturbance would be reduced to negligible values by the positioning of a glass with a transparent conductive coating a quarter wavelength distance in front of the indicator. This would also increase the sensitivity of the indicator. The styrofoam encasement of the disks protects them from drafts and infrared radiation from the back and sides.

Positioning or directing of the calorimeter such that the radiation is incident from the back (or bottom as seen in FIG. 2) is facilitated by arranging the liquid crystals in concentric rings. This is, an observer can readily tell whether the rings exhibiting the color play have uniform color play throughout. If not, the meter can be redirected until uniform color play in a circular pattern is observed. Other arrangements of liquid crystals may be employed. For example, the liquid crystals giving color play at the same temperature can be arranged in the form of points on a cross and identified by number. Thus, radiation intensity would be measured by noting the difference in numbers between the radiation-sensitive region and the reference region.

Having thus described a number of variations of my invention, persons skilled in the art will be able to substitute equivalent materials for those disclosed and to modify the structure illustrated while continuing to practice the principle of the invention; and it is, therefore, intended to cover such modifications and substitutions as they are embraced within the spirit and scope of the claims.

I claim:

1. A detector for determining the intensity of a microwave field comprising: a layer of resistive material adapted to receive said microwave field for providing induced internal electrical currents in response thereto thereby establishing a temperature on said layer corresponding to the microwave field; a first plurality of regions of temperature sensitive film means disposed in thermal conducting relation with said layer of resistive material for facilitating heat transfer between said film means and said layer and for providing a visible color play representative of said temperature, each region exhibiting color play at a different temperature and said regions arranged in spaced relation in a predetermined pattern; a second plurality of regions of temperature sensitive film means disposed in thermal isolating relation with said layer of resistive material to inhibit heat transfer between said second plurality of film means and said layer, each region of said second plurality corresponding to an associated region of said first plurality and exhibiting a corresponding color play at the same temperature as the associated region, all of said regions of said second plurality being arranged in a pattern similar to the pattern of said first regions; whereby one region of said second plurality has a given visible display responsive only to ambient temperature, and a region of said first plurality exhibits color play responsive to the cumulative effect of ambient temperature and heating in the resistive layer due to incident microwave energy, the difference in color play of said first and second plurality of regions being a measure of the intensity of microwave energy.

2. A detector as set forth in claim 1, wherein said temperature sensitive film means comprises cholesteric liquid crystalline phase material, a composition for each of said regions exhibiting color play at a different temperature.

3. A detector as set forth in claim 2, further including means providing a light-absorbing surface contiguous to said temperature sensitive film means between it and said layer of resistive material to absorb light not scattered by the temperature sensitive film means.

4. A detector as set forth in claim 3, wherein said light-absorbing surface comprises a layer of black paint.

5. A detector as set forth in claim 1, wherein said areas of temperature sensitive film means comprise liquid crystals arranged in concentric circular rings.

6. A detector as set forth in claim 5, wherein said first plurality of regions comprise a radiation-sensitive unit and said second plurality of regions comprise a reference unit, said regions of each unit being arranged as sets of concentric rings paired with corresponding rings of the other unit, the two units having substantially the same composition and range of temperature sensitivity, only the radiation-sensitive unit being in thermal conducting relation with said layer of resistive material, so that the reference unit has a color play showing only the ambient heating conditions whether or not a microwave field is present, while the radiation-sensitive unit has a color play responsive to said microwave field, the intensity of the microwave field being determined by the difference of color play between the radiation-sensitive unit and the reference unit.

7. A detector as set forth in claim 6, further including a sliding scale mounted across said radiation-sensitive and said reference units to measure the distance between the rings having a color play of the two units to thereby indicate the intensity of the microwave field.

8. A detector as set forth in claim 7, wherein said units are both mounted in a styrofoam support which shields the sides and the back from at least some radiation outside of the spectrum of said microwave field, the detector being used to have the microwave source radiating toward said back side, and the front being the viewing side having said temperature sensitive film means and the pattern of said regions being arranged to give a visual display that the incident microwave energy is normal to the plane of said film means.

9. A detector as set forth in claim 8, further including a light-absorbing means contiguous to the back side of said temperature sensitive film means to absorb light not scattered by the temperature sensitive film means.

10. A detector as set forth in claim 9, wherein said concentric rings of liquid crystals comprise different proportions of Cholesteryl Oleyl Carbonate and Cholesteryl Nonanoate to obtain the different ranges of temperature sensitivity.

11. A detector as set forth in claim 10, wherein p- (p Ethoxyphenyl - azo) phenyl Hexanoate has been added as an ultraviolet absorber, and a silicone resin has been added to reduce deterioration of intensity of color play due to oxygen and atmopsheric contaminants.

12. A detector for determining the intensity of a microwave field comprisng a main detection unit and a reference detection unit, both mounted on a common support means; each of said detection units having a plurality of areas with temperature sensitive means, arranged in corresponding pairs of said areas, each pair having one area on the main detection unit and one area on the reference detection unit, the two areas of a pair being sensitive to substantially the same temperature range, and the pairs being sensitive to different temperature ranges arranged in a graduated pattern; a continuous layer of resistive material adjacent to only said areas of the main detection unit, adapted to receive said microwave field for providing induced electrical currents to produce heating corresponding to the intensity of the microwave field; so that both detection units respond to ambient heating conditions, while only the main detection unit responds to a microwave field; and observation of one area of the main detection unit having a given display and one area of the reference detection unit having a given display is used to determine the intensity of the microwave field.

13. A detector as set forth in claim 12, further including a sliding scale mounted across said main and said reference detection units to measure the distance between the rings having the given display of the two units to thereby indicate the intensity of the microwave field.

14. A detector as set forth in claim 13, wherein said areas of temperature sensitive means comprise liquid crystals arranged in concentric circular rings, and the given displays are color displays.

15. A detector as set forth in claim 14, further including a layer of black paint on each of said detection units contiguous to said temperature sensitive means to absorb light not scattered by the temperature sensitive means.

16. A detector as set forth in claim 15, wherein said common support means is of styrofoam which shields the sides and the back from at least some radiation outside of the spectrum of said microwave field, the detector being used with the microwave source radiating toward said back side, and the front being the viewing side having said temperature sensitive means.

17. A detector as set forth in claim 12, further including a layer of black paint on each of said detection units adjacent to said temperature sensitive means to absorb light not scattered by the temperature sensitive means

18. A detector as set forth in claim 17, wherein said temperature sensitive means comprises cholesteric liquid crystalline phase material, with a different composition for each of said pairs of areas.

19. A detector as set forth in claim 18, wherein said areas of temperature sensitive means are rings arranged in concentric circles on each said detection unit.

20. A detector as set forth in claim 12, wherein said temperature sensitive means comprises cholesteric liquid crystalline phase material, with a different composition for each of said pairs of areas.

* * * * *